(12) United States Patent
Jansale Venkatesha et al.

(10) Patent No.: US 12,449,738 B2
(45) Date of Patent: Oct. 21, 2025

(54) ROTARY SUBSTRATE SUPPORT FOR ALIGNING A SUBSTRATE

(71) Applicant: Applied Materials, Inc., Santa Clara, CA (US)

(72) Inventors: Nagesha Jansale Venkatesha, Bengaluru (IN); Yacov Elgar, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 174 days.

(21) Appl. No.: 18/211,950

(22) Filed: Jun. 20, 2023

(65) Prior Publication Data

US 2024/0427255 A1    Dec. 26, 2024

(51) Int. Cl.
*G03F 7/00* (2006.01)

(52) U.S. Cl.
CPC .......... *G03F 7/70775* (2013.01); *G03F 7/707* (2013.01); *G03F 7/70716* (2013.01); *G03F 7/70758* (2013.01)

(58) Field of Classification Search
CPC .. G03F 7/707; G03F 7/70716; G03F 7/70758; G03F 7/70775
See application file for complete search history.

(56) References Cited

U.S. PATENT DOCUMENTS

| | | | |
|---|---|---|---|
| 7,579,120 B2 | 8/2009 | Akagawa | |
| 10,249,525 B2 * | 4/2019 | Schaller | G05B 19/418 |
| 2003/0082466 A1 * | 5/2003 | del Puerto | G03F 7/707 |
| | | | 430/22 |
| 2004/0177813 A1 * | 9/2004 | Schieve | H01L 21/68742 |
| | | | 118/728 |
| 2004/0185751 A1 | 9/2004 | Nakanishi et al. | |
| 2005/0160992 A1 * | 7/2005 | Sundar | H01L 21/68728 |
| | | | 118/729 |
| 2010/0224130 A1 | 9/2010 | Smith et al. | |
| 2012/0322239 A1 | 12/2012 | Singh et al. | |

(Continued)

FOREIGN PATENT DOCUMENTS

| | | |
|---|---|---|
| JP | 2006005226 A | 1/2006 |
| KR | 20150053684 A | 5/2015 |
| KR | 10-2317402 B1 | 10/2021 |

OTHER PUBLICATIONS

International Search Report for PCT/US2024/033559, dated Sep. 12, 2024.

*Primary Examiner* — Deoram Persaud
(74) *Attorney, Agent, or Firm* — Moser Taboada

(57) ABSTRACT

Embodiments of substrate supports for aligning a substrate are provided herein. In some embodiments, a substrate support for aligning a substrate include: a base plate; a rotary assembly including a stator coupled to the base plate and a rotor rotatably coupled to the stator via a bearing disposed therebetween; a bellows assembly fixed to the rotor; and a lever having a first end coupled to the rotor and a second end configured to be coupled to an actuator; and a chuck assembly disposed atop the base plate and fixedly coupled to the bellows assembly, wherein the chuck assembly is rotationally and axially movable along a central axis with respect to the base plate, and wherein rotation of the lever about the central axis rotates the bellows assembly and the chuck assembly with respect to the base plate to align the substrate with respect to the base plate.

20 Claims, 4 Drawing Sheets

(56) References Cited

U.S. PATENT DOCUMENTS

| | | | |
|---|---|---|---|
| 2015/0170952 A1* | 6/2015 | Subramani | H01J 37/32091 |
| | | | 361/234 |
| 2018/0174880 A1* | 6/2018 | Swaminathan | H01L 21/67115 |
| 2019/0109036 A1 | 4/2019 | Yudovsky | |
| 2021/0066038 A1* | 3/2021 | Boyd, Jr. | H01J 37/32697 |
| 2022/0293452 A1* | 9/2022 | Sulyman | H01L 21/68742 |
| 2022/0406640 A1* | 12/2022 | Brezoczky | H01L 21/67706 |
| 2023/0282506 A1* | 9/2023 | Subramani | H01L 21/6831 |
| | | | 118/723 I |
| 2024/0160117 A1* | 5/2024 | Lubomirsky | H01L 21/67017 |

* cited by examiner

ROTARY SUBSTRATE SUPPORT FOR ALIGNING A SUBSTRATE

FIELD

Embodiments of the present disclosure generally relate to substrate processing equipment.

BACKGROUND

Printing systems including scanners are suitable for a variety of applications including printing text on paper, patterning photoresist during integrated circuit manufacture, and creating masks or reticles for projection-type photolithography systems. For integrated circuit applications, laser printing systems typically require submicron precision. A concern for a precision scanner is the orientation of a workpiece, or photomask, with respect to laser beams. If the propagation direction and the scanning direction are not collinear, the turning on and turning off of beams can reduce sharpness of edges or create undesired skew or directional bias in a pattern being illuminated. However, conventional methods of rotating and aligning the photomask may be overly complex and not precise.

Accordingly, the inventors have provided herein embodiments of improved laser printing systems.

SUMMARY

Embodiments of substrate supports for aligning a substrate are provided herein. In some embodiments, a substrate support for aligning a substrate include: a base plate; a rotary assembly including a stator coupled to the base plate and a rotor rotatably coupled to the stator via a bearing disposed therebetween; a bellows assembly fixed to the rotor; and a lever having a first end coupled to the rotor and a second end configured to be coupled to an actuator; and a chuck assembly disposed atop the base plate and fixedly coupled to the bellows assembly, wherein the chuck assembly is rotationally and axially movable along a central axis with respect to the base plate, and wherein rotation of the lever about the central axis rotates the bellows assembly and the chuck assembly with respect to the base plate to align the substrate with respect to the base plate.

In some embodiments, a substrate support for aligning a substrate includes: a stage configured for movement along an x-direction, a y-direction, and a z-direction; a partholder assembly disposed on the stage and comprising: a base plate; a rotary assembly including a stator coupled to the base plate and a rotor rotatably coupled to the stator via a bearing disposed therebetween; a bellows assembly fixed to the rotor and configured for vertical movement; and a lever having a first end coupled to the rotor and a second end coupled to an actuator; and a chuck assembly disposed atop the base plate and fixedly coupled to the bellows assembly, wherein the chuck assembly is rotationally and axially movable along a central axis with respect to the base plate, and wherein rotation of the lever about the central axis rotates the chuck assembly with respect to the base plate to align the substrate with respect to the base plate.

In some embodiments, a laser printing system for processing a photomask includes: an enclosure defining an interior volume; a substrate support disposed in the interior volume, the substrate support comprising: a base plate; a rotary assembly including a stator coupled to the base plate and a rotor rotatably coupled to the stator via a bearing disposed therebetween; a bellows assembly fixed to the rotor; and a lever having a first end coupled to the rotor and a second end coupled to an actuator; and a chuck assembly disposed atop the base plate and fixedly coupled to the bellows assembly, wherein the chuck assembly is rotationally and axially movable along a central axis with respect to the base plate, and wherein rotation of the lever about the central axis rotates the chuck assembly with respect to the base plate to align the substrate with respect to the base plate; and an edge finder disposed above the base plate and configured to facilitate finding an edge of the photomask when placed on the chuck assembly.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
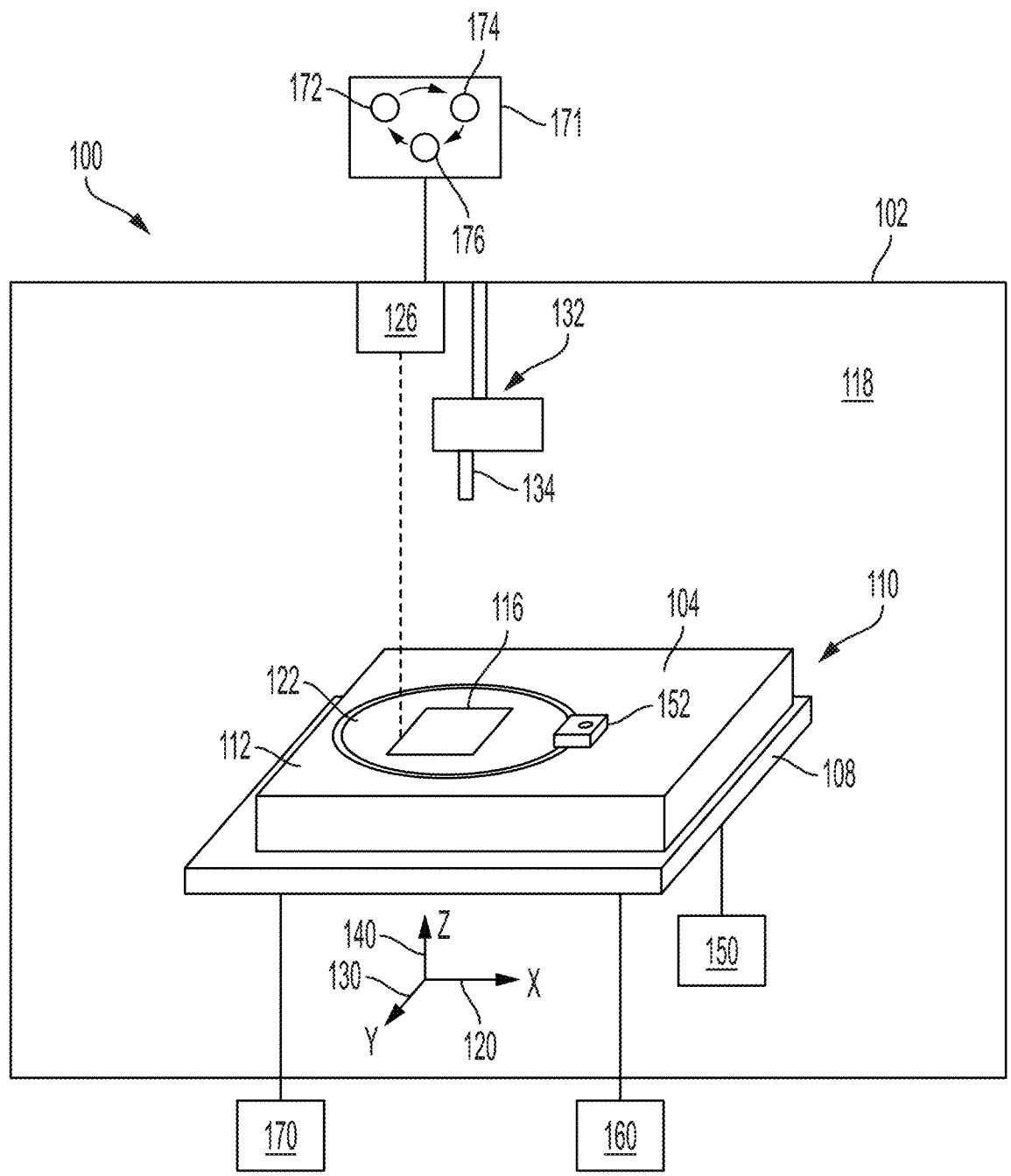
FIG. 1 depicts a schematic isometric view of laser printing system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports for use in laser writing systems such as laser printing systems are provided herein. The substrate support may generally include a chuck assembly having a support surface. The chuck assembly is disposed on a base plate, where the chuck assembly is rotatably coupled to the base plate to align a substrate, such as a photomask, when placed on the chuck assembly. The base plate is coupled to an actuator configured to rotate the chuck assembly for precise substrate alignment. A gas source may be coupled to the substrate support and configured to supply gas to a region between the chuck assembly and the base plate to raise the chuck assembly with respect to the base plate. Once the chuck assembly is raised, the actuator can be moved to rotate the chuck assembly in a desired position. Once the chuck assembly is aligned, the chuck assembly may then be lowered and held or clamped via any suitable manner to the base plate to maintain the desired position.

Conventional apparatus for rotating the chuck assemblies may use excessive tubing and electrical wiring. The embodiments of substrate supports provided herein advantageously reduce complexity of parts and promote ease of assembly and serviceability.

FIG. 1 depicts a schematic isometric view of laser printing system 100 in accordance with at least some embodiments of the present disclosure. The laser printing system 100 may be a laser photomask writer, or the like. The laser printing system 100 may have an enclosure 102 defining an interior volume 118 therein. A substrate support 110 is disposed in the interior volume 118 to support a substrate 116. In some embodiments, the substrate 116 is a photomask. However, the substrate 116 may be any other suitable substrate used in the semiconductor industry. The substrate support 110 generally comprises a partholder assembly 104 and a stage 108, where the stage 108 is disposed below the partholder assembly 104.

The stage 108 is configured to move the partholder assembly 104 along one or more of an x-direction 120, a y-direction 130, and a z-direction 140. As such, the stage 108 may be coupled to a motion control device 150 configured to move the stage 108. The motion control device 150 may comprise any suitable electronic device or devices, such as, for example, one or more motors, one or more actuators, or the like and associated motion enabling structures such as gears, belts, chains, or the like. The stage 108 may comprise one or more plates. For example, the stage 108 comprises a first plate capable of motion in the x-direction 120 and a second plate capable of motion in the y-direction 130 such that together, the first plate and the second plate are configured to move the stage in the x-direction 120 and the y-direction 130.

The partholder assembly 104 generally includes a base plate 112 and a chuck assembly 122 configured to support a substrate and supported by the base plate 112. In some embodiments, the base plate 112 is made of glass. The chuck assembly 122 is rotatable with respect to the base plate 112 so that the substrate 116, when disposed on the chuck assembly 122, may be aligned with the base plate 112, and by extension, the stage 108. In some embodiments, an edge finder 126 is disposed above the base plate 112 and configured to facilitate finding an edge 119 of the substrate 116 when placed on the chuck assembly 122. A laser assembly 132 is disposed above the base plate 112 and configured to create a pattern on the substrate 116. The laser assembly 132 may comprise one or more lasers 134 suitable for generating the pattern.

In some embodiments, a gas source 160 is coupled to the substrate support 110 and configured to supply gas to a region (described in more detail with respect to FIG. 3) between the chuck assembly 122 and the base plate 112 to raise the chuck assembly 122 with respect to the base plate 112. In some embodiments, the substrate support 110 is coupled to a vacuum source 170 configured to vacuum chuck the chuck assembly 122 to the base plate 112 post-alignment to advantageously reduce or prevent movement of the chuck assemble 122 with respect to the base plate 112 once aligned. In some embodiments, the vacuum source 170 may be configured to vacuum chuck the substrate 116 to the chuck assembly 122 once aligned. The vacuum source 170 may generally comprise a pump and associated valves. In some embodiments, the chuck assembly 122 may be mechanically held with the base plate 112 post-alignment. For example, a clamp 152 coupled to the stage 108 or base plate 112 may hold the chuck assembly 122 against the base plate 112.

The laser printing system 100 may include a controller 171 to control the operation of the laser printing system 100. The controller 171 generally includes a central processing unit (CPU) 172, a memory 174, and a support circuit 176. The CPU 172 may be one of any form of a general-purpose computer processor that can be used in an industrial setting. The support circuit 176 is conventionally coupled to the CPU 172 and may comprise a cache, clock circuits, input/output subsystems, power supplies, and the like. Software routines, such as processing methods as described herein may be stored in the memory 174 and, when executed by the CPU 172, transform the CPU 172 into a controller 171. The software routines may also be stored and/or executed by a second controller (not shown) that is located remotely from the laser printing system 100.

In operation, the controller 171 enables data collection and feedback from the laser printing system 100 to optimize performance of the laser printing system 100 and provides instructions to system components. For example, the controller 171 may be configured to use data from the edge finder 126 to determine a location of the substrate 116 and provide instructions to the laser printing system 100 to control a rotational position of the chuck assembly 122 with respect to the base plate 112. The memory 174 can be a non-transitory computer readable storage medium having instructions that when executed by the CPU 172 (or controller 171) perform the methods described herein.

Embodiments in accordance with the present disclosure may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

Figure 2:
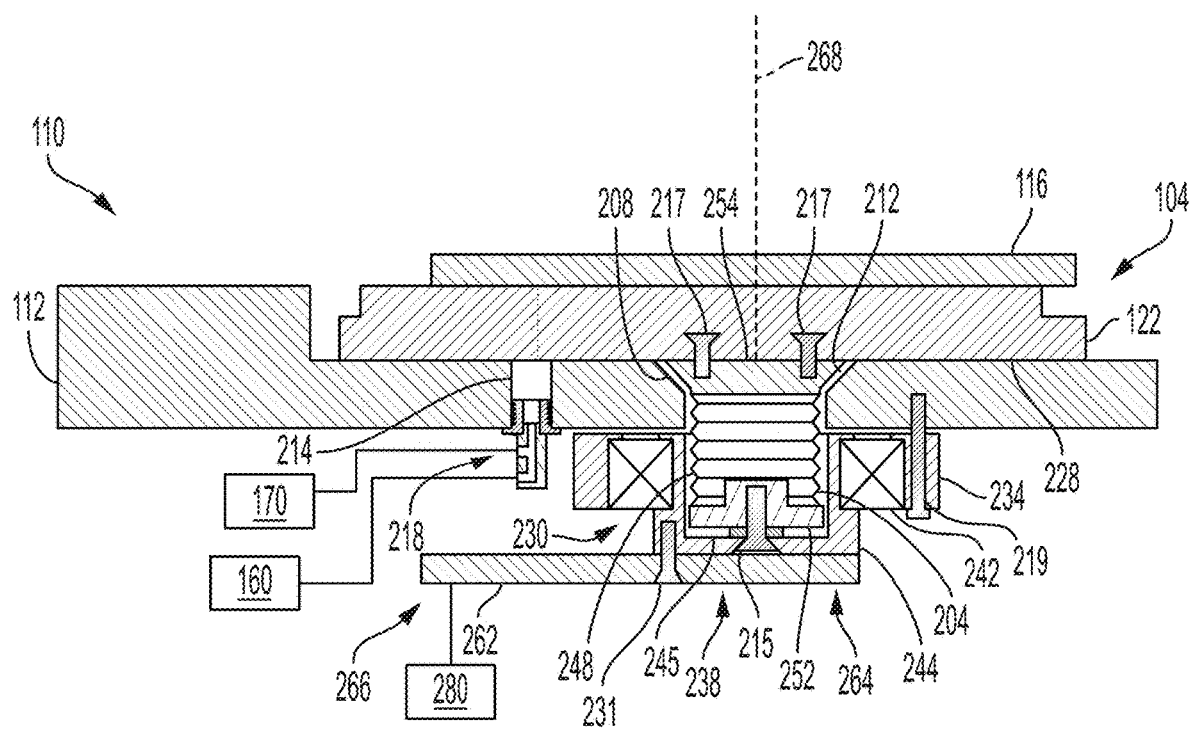
FIG. 2 depicts a schematic cross-sectional side view of a substrate support for use in a laser printing system in accordance with at least some embodiments of the present disclosure.

FIG. 2 depicts a schematic side view of a substrate support 110 for use in a laser printing system in accordance with at least some embodiments of the present disclosure. The partholder assembly 104 includes a bellows assembly 204 coupled to the chuck assembly 122. The bellows assembly 204 includes a bellows 248 that may be made of a metal. The bellows 248 may have circular pleats that allow the bellows 248 to expand vertically while the chuck assembly 122 is lifted while still being rotationally rigid. For example, the bellows assembly 204 generally provides vertical flexibility of the chuck assembly 122 with respect to the base plate 112 while restricting rotational flexibility with respect to the base plate 112. The base plate 112 includes an opening 208 and a portion of the bellows assembly 204 extends through the opening 208 while maintaining a gap 212 between the bellow assembly 204 and sidewalls of the opening 208.

In some embodiments, the base plate 112 includes one or more through holes 214 and the partholder assembly 104 includes a gas port 218 fluidly coupled to the one or more through holes 214. The gas port 218 may be coupled to the gas source 160 and configured to facilitate gas flow to a lower side 228 of the chuck assembly 122 to raise the chuck assembly 122 with respect to the base plate 112. The gas port 218 may also be advantageously coupled to the vacuum source 170 to provide vacuum chucking between the base plate 112 and the chuck assembly 122. In some embodiments, the partholder assembly 104 may include separate ports for providing gas to the lower side 228 and for providing vacuum chucking.

Figure 5:
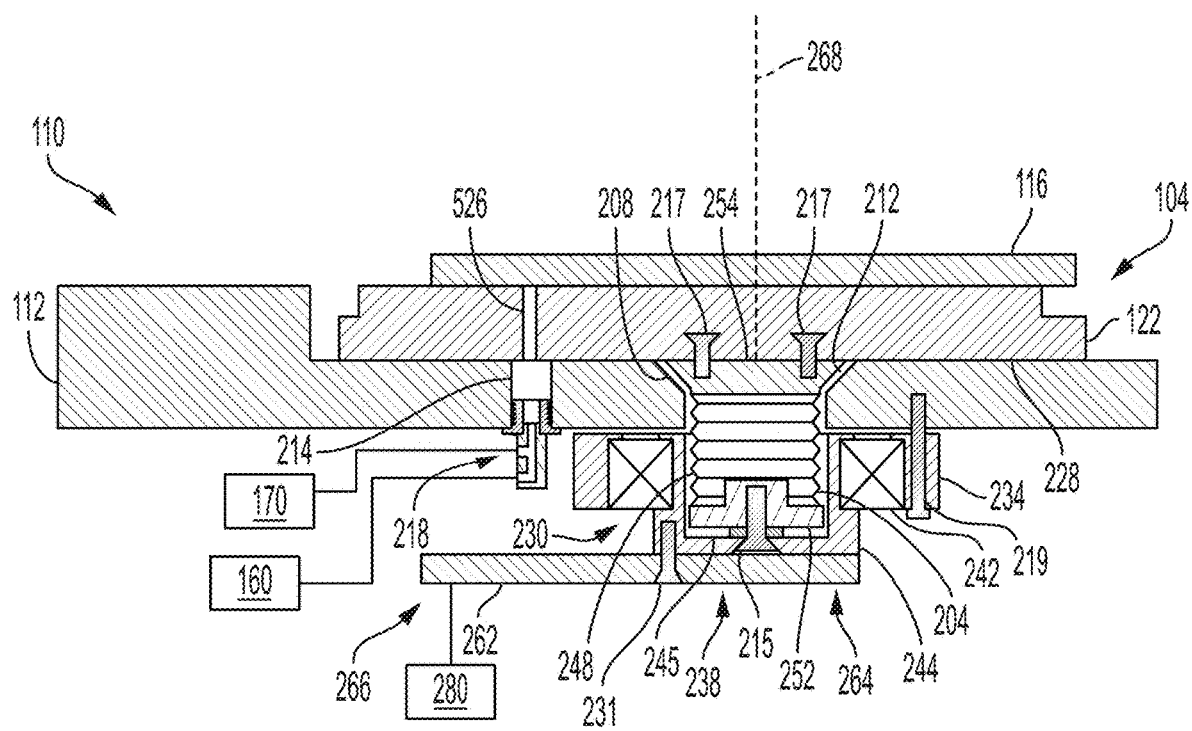
FIG. 5 depicts a schematic cross-sectional side view of a substrate support for use in a laser printing system in accordance with at least some embodiments of the present disclosure.

In some embodiments, as illustrated in FIG. 5, the chuck assemble 122 may include one or more holes 526 configured for vacuum chucking the substrate 116 to the chuck assemble 122. In some embodiments, the one or more holes 526 have a diameter less than the one or more through holes 214.

Returning back to FIG. 2, the partholder assembly 104 includes a rotary assembly 230 including a stator 234 coupled to the base plate 112, for example, via one or more fasteners 219, and a rotor 238 rotatably coupled to the stator 234 via a bearing 242 disposed therebetween. The stator 234 comprises stationary components of the rotary assembly 230 that are fixed to the base plate 112. The bellows assembly 204 is fixed to the rotor 238 and configured for vertical movement. The bellows assembly 204 rotates with the rotor 238. In some embodiments, the rotor 238 comprises a cup 244. In some embodiments, the bellows assembly 204 includes the bellows 248 partially disposed in the cup 244. In some embodiments, a lower flange 252 of the bellows 248 is coupled to a bottom 245 of the cup 244, for example, via one or more fasteners 215. In some embodiments, an upper flange 254 of the bellows 248 is coupled to the chuck assembly 122, for example, via one or more fasteners 217.

The partholder assembly 104 includes a lever 262 having a first end 264 coupled to the rotor 238 and a second end 266 coupled to an actuator 280. In some embodiments, the lever 262 is coupled to the rotor 238 via one or more fasteners 231. The chuck assembly 122 is disposed atop the base plate 112 and fixedly coupled to the bellows assembly 204. The chuck assembly 122 is rotationally and axially (e.g., z-direction 140) movable along a central axis 268 with respect to the base plate 112. Rotation of the lever 262 about the central axis 268 via the actuator 280 rotates the chuck assembly 122 with respect to the base plate 112 to align the substrate with respect to the base plate. The actuator 280 is configured to make precise rotational movements of the lever 262. For example, the actuator 280 is configured to rotate the chuck assembly 122 plus or minus about 5 degrees about the central axis 268.

Figure 3:
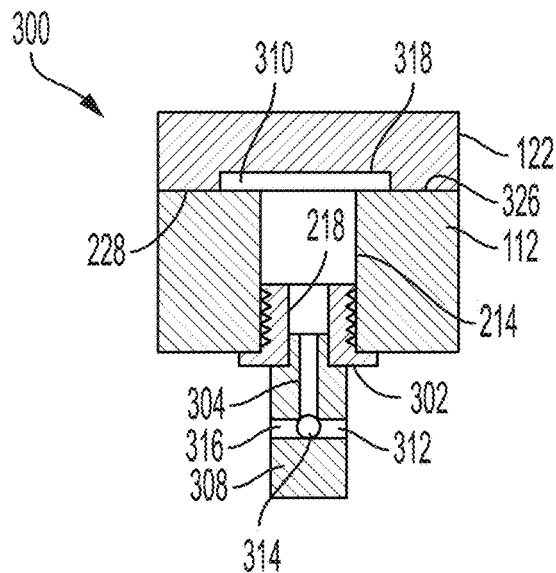
FIG. 3 depicts an enlarged schematic cross-sectional view of a gas port region of a substrate support in accordance with at least some embodiments of the present disclosure.

FIG. 3 depicts an enlarged view of a gas port region 300 of a substrate support 210 in accordance with at least some embodiments of the present disclosure. The gas port 218 may be defined in a bushing 302 coupled to the base plate 112. In some embodiments, a body 308 is coupled to the bushing 302 to facilitate coupling a conduit 304 to the gas port 218 to provide either gas or vacuum to the gas port 218. For example, the conduit 304 may be selectively coupled to a first port 312 for receiving gas from the gas source 160 and a second port 316 coupled to the vacuum source 170. In some embodiments, a junction 314 is disposed proximate an intersection between the conduit 304, the first port 312, and the second port 316. In some embodiments, the junction 314 includes one or more valves for selectively opening or closing the first port 312 and the second port 316. In some embodiments, the junction 314 is a T-junction without any valves or flow restrictors.

In some embodiments, the lower side 228 of the chuck assembly 122 includes a channel 318 that defines a trapped volume 310 disposed between the chuck assembly 122 and the base plate 112 proximate the gas port 218. In some embodiments, the channel 318 is an annular channel. In some embodiments, the channel 318 has a width greater than the diameter of the one or more through holes 214. The trapped volume 310 advantageously provides a greater volume for gas from the gas source 160 to spread into and thereby provide a greater force on the lower side 228 to raise the chuck assembly 122 slightly above an upper surface 326 of the base plate 112. With the chuck assembly 122 raised, the chuck assembly 122 may advantageously be rotated via the lever 262 with minimal or no frictional forces generated between the upper surface 326 of the base plate 112 and the lower side 228 of the chuck assembly 122.

Figure 4:
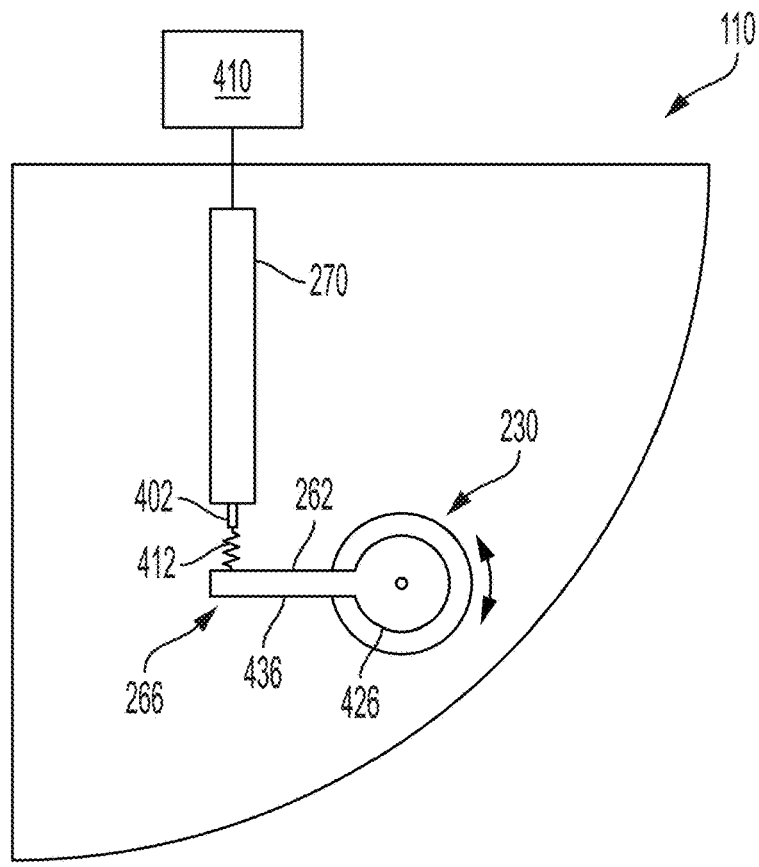
FIG. 4 depicts a schematic partial bottom view of a substrate support in accordance with at least some embodiments of the present disclosure.

FIG. 4 depicts a partial bottom view of a substrate support 110 in accordance with at least some embodiments of the present disclosure. The actuator 270 is coupled to a second end 266 of the lever 262. In some embodiments, the actuator is a linear actuator. A power source 410 may be coupled to the actuator 270 to provide power to the actuator 270 to move a shaft 402 of the actuator. In some embodiments, the shaft 402 may be actuated via a pneumatic line.

In some embodiments, the lever 262 comprises a circular plate 426 coupled to the rotor 238 and an elongate arm 436 extending from the circular plate 426 and having the second end 266 of the lever 262. In some embodiments, a flexure 412 is disposed between and coupled to the second end 266 of the lever 262 and the actuator 270. The flexure 412 may advantageously facilitate translating linear motion of the shaft 402 to rotational movement of the lever 262.

While the foregoing is directed to embodiments of the present disclosure, other and further embodiments of the disclosure may be devised without departing from the basic scope thereof.

The invention claimed is:

1. A substrate support for aligning a substrate, comprising:
a base plate;
a rotary assembly including a stator coupled to the base plate and a rotor rotatably coupled to the stator via a bearing disposed therebetween;
a bellows assembly having a bellows fixed to the rotor, wherein the bellows is disposed radially inward of the stator and within a central opening of the stator; and
a lever having a first end coupled to the rotor and a second end configured to be coupled to an actuator; and
a chuck assembly configured to support the substrate, the chuck assembly disposed atop the base plate and fixedly coupled to the bellows assembly, wherein the chuck assembly is rotationally and axially movable along a central axis with respect to the base plate, and wherein rotation of the lever about the central axis rotates the bellows assembly and the chuck assembly with respect to the base plate to align the substrate with respect to the base plate when the substrate is disposed on the chuck assembly.

2. The substrate support of claim 1, further comprising an actuator coupled to the second end of the lever and a flexure disposed between the second end of the lever and the actuator.

3. The substrate support of claim 1, wherein the lever extends radially outward of the stator and the rotor.

4. The substrate support of claim 2, wherein the actuator is a linear actuator configured to move the lever to rotate the chuck assembly.

5. The substrate support of claim 1, wherein the substrate support includes a gas port, and the gas port is fluidly coupled to a through hole in the base plate configured to facilitate gas flow to a lower side of the chuck assembly to raise the chuck assembly with respect to the base plate and to extend a bellows of the bellows assembly.

6. The substrate support of claim 5, further comprising a trapped volume disposed between the chuck assembly and the base plate proximate the gas port.

7. The substrate support of claim 1, wherein the base plate includes one or more holes configured for vacuum chucking the chuck assembly to the base plate.

8. The substrate support of claim 1, further comprising a clamp configured to selectively hold the chuck assembly against the base plate.

9. The substrate support of claim 1, wherein the rotor comprises a cup, and wherein the bellows assembly includes a bellows partially disposed in the cup with a lower flange of the bellows coupled to a bottom of the cup and an upper flange of the bellows coupled to the chuck assembly.

10. A substrate support for aligning a substrate, comprising:
  a stage configured for movement along an x-direction, a y-direction, and a z-direction;
  a partholder assembly disposed on the stage and comprising:
    a base plate;
    a rotary assembly including a stator coupled to the base plate and a rotor rotatably coupled to the stator via a bearing disposed therebetween;
    a bellows assembly fixed to the rotor and configured for vertical movement; and
    a lever having a first end coupled to the rotor and a second end coupled to an actuator and extending radially outward of the stator and the rotor; and
  a chuck assembly configured to support the substrate, the chuck assembly disposed atop the base plate and fixedly coupled to the bellows assembly, wherein the chuck assembly is rotationally and axially movable along a central axis with respect to the base plate, and wherein rotation of the lever about the central axis rotates the chuck assembly with respect to the base plate to align the substrate with respect to the base plate when the substrate is disposed on the chuck assembly.

11. The substrate support of claim 10, wherein the substrate that the chuck assembly is configured to support is a photomask.

12. The substrate support of claim 10, wherein the base plate is made of glass.

13. The substrate support of claim 10, wherein the base plate includes an opening, and a portion of the bellows assembly extends through the opening while maintaining a gap between the bellow assembly and sidewalls of the opening.

14. The substrate support of claim 10, wherein the base plate includes a through hole and the partholder assembly includes a gas port fluidly coupled to the through hole.

15. A laser printing system for processing a photomask, comprising:
  an enclosure defining an interior volume;
  a substrate support disposed in the interior volume, the substrate support comprising:
    a base plate;
    a rotary assembly including a stator coupled to the base plate and a rotor rotatably coupled to the stator via a bearing disposed therebetween;
    a bellows assembly having a bellows fixed to the rotor, wherein the bellows is disposed radially inward of the stator and within a central opening of the stator; and
    a lever having a first end coupled to the rotor and a second end coupled to an actuator; and
    a chuck assembly configured to support a photomask, the chuck assembly disposed atop the base plate and fixedly coupled to the bellows assembly, wherein the chuck assembly is rotationally and axially movable along a central axis with respect to the base plate, and wherein rotation of the lever about the central axis rotates the chuck assembly with respect to the base plate to align the photomask with respect to the base plate when the photomask is disposed on the chuck assembly; and
  an edge finder disposed above the base plate and configured to facilitate finding an edge of the photomask when placed on the chuck assembly.

16. The laser printing system of claim 15, further comprising a stage disposed in the interior volume below the base plate and configured to move the base plate along an x-direction, a y-direction, and a z-direction.

17. The laser printing system of claim 15, further comprising a gas source coupled to the substrate support and configured to supply gas to a region between the chuck assembly and the base plate to raise the chuck assembly with respect to the base plate.

18. The laser printing system of claim 15, further comprising a laser assembly disposed above the base plate and configured to create a pattern on the photomask when disposed on the chuck assembly.

19. The laser printing system of claim 15, wherein the stator is directly coupled to the base plate via one or more fasteners.

20. The laser printing system of claim 15, wherein the rotary assembly includes a gas port and further comprising a vacuum source coupled to the gas port.

* * * * *